US012575266B2

(12) United States Patent
Peng et al.

(10) Patent No.: US 12,575,266 B2
(45) Date of Patent: Mar. 10, 2026

(54) DISPLAY SUBSTRATE WITH ISOLATION GROOVE DISPOSED BETWEEN PIXELS AND DISPLAY APPARATUS

(71) Applicant: BOE Technology Group Co., Ltd., Beijing (CN)

(72) Inventors: Jintao Peng, Beijing (CN); Yanan Niu, Beijing (CN); Zhikun Gao, Beijing (CN); Tingting Zhou, Beijing (CN); Bin Qin, Beijing (CN); Shuang Sun, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 428 days.

(21) Appl. No.: 18/023,381

(22) PCT Filed: Mar. 16, 2022

(86) PCT No.: PCT/CN2022/081202
§ 371 (c)(1),
(2) Date: Feb. 27, 2023

(87) PCT Pub. No.: WO2023/173327
PCT Pub. Date: Sep. 21, 2023

(65) Prior Publication Data
US 2024/0276775 A1 Aug. 15, 2024

(51) Int. Cl.
*H10K 59/122* (2023.01)
*H10K 59/35* (2023.01)
(52) U.S. Cl.
CPC ........... *H10K 59/122* (2023.02); *H10K 59/35* (2023.02)

(58) Field of Classification Search
CPC ..................................................... H10K 59/35
See application file for complete search history.

(56) References Cited

U.S. PATENT DOCUMENTS

2016/0013436 A1* 1/2016 Im .......................... H10K 50/84
257/40
2016/0118449 A1 4/2016 Sato et al.
(Continued)

FOREIGN PATENT DOCUMENTS

CN 111554822 A 8/2020
CN 111937154 A 11/2020
(Continued)

*Primary Examiner* — Peter Bradford
(74) *Attorney, Agent, or Firm* — Ling Wu; Stephen Yang; Ling and Yang Intellectual Property

(57) ABSTRACT

A display substrate includes a light emitting structure layer arranged on a base substrate, the light emitting structure layer includes a first electrode layer, a pixel definition layer, a light emitting functional layer, a second electrode layer, a third electrode layer and an electrode insulation layer; the first electrode layer includes multiple first electrodes, and the pixel definition layer is provided with a pixel opening exposing a first electrode and a grid-shaped isolation groove structure; the third electrode layer and the electrode insulation layer are sequentially stacked on a side of the pixel definition layer the light emitting functional layer and the second electrode layer are sequentially stacked; the second electrode layer and the third electrode layer are configured to be equipotential; the light emitting functional layer includes at least two stacked light emitting units and a charge generation layer positioned between two adjacent light emitting units.

16 Claims, 4 Drawing Sheets

(56)     References Cited

U.S. PATENT DOCUMENTS

| | | | |
|---|---|---|---|
| 2016/0149155 A1* | 5/2016 | Kim | H10K 59/124 |
| | | | 438/23 |
| 2016/0181331 A1* | 6/2016 | Li | H10K 50/17 |
| | | | 438/34 |
| 2017/0271421 A1* | 9/2017 | Jinbo | H10K 59/124 |
| 2018/0061907 A1* | 3/2018 | Kim | H10K 59/351 |
| 2019/0181205 A1* | 6/2019 | Kim | H10K 50/844 |
| 2020/0343322 A1* | 10/2020 | Jia | H10K 59/122 |
| 2020/0365672 A1* | 11/2020 | Choi | H10K 59/124 |
| 2021/0151714 A1 | 5/2021 | Haas et al. | |
| 2022/0115469 A1 | 4/2022 | Huang et al. | |
| 2023/0209909 A1* | 6/2023 | Byun | H10K 59/8731 |
| | | | 257/40 |

FOREIGN PATENT DOCUMENTS

| | | | |
|---|---|---|---|
| CN | 113921573 A | 1/2022 | |
| CN | 113991041 A | 1/2022 | |
| CN | 114097092 A | 2/2022 | |
| KR | 20160001500 A * | 1/2016 | H10K 71/621 |

* cited by examiner

DISPLAY SUBSTRATE WITH ISOLATION GROOVE DISPOSED BETWEEN PIXELS AND DISPLAY APPARATUS

CROSS-REFERENCE TO RELATED APPLICATION

The present application is a U.S. National Phase Entry of International Application PCT/CN2022/081202 having an international filing date of Mar. 16, 2022, and entitled "Display Substrate and Display Apparatus". The entire contents of the above-identified applications are hereby incorporated by reference.

TECHNICAL FIELD

Embodiments of the present disclosure relate to, but are not limited to, the field of display technologies, and more particularly to a display substrate and a display apparatus.

BACKGROUND

Silicon-based organic light emitting diode (OLED) technology, as a near-eye micro-display technology, is more and more widely used in industries, cultural tourism, medical treatment, unmanned aerial vehicles and other fields. Augmented reality (AR) glasses, virtual reality (VR) helmets, infrared detectors, 3D medical equipment and other fields have strong demand for silicon-based OLED display panels, and silicon-based OLED display technology has broad development space.

Due to a high pixel density (PPI) of silicon-based OLED display panel, spacing between sub-pixels is very small. Therefore, white light devices are generally prepared by evaporation of luminescent materials on a whole surface, and RGB (red, green and blue) color filters are used to realize full-color display. In addition, in order to improve efficiency, brightness and service life of a silicon-based OLED microdisplays, stacked OLED devices with two or more light-emitting layers (series OLED devices) are adopted, that is, a charge generation layer (CGL) is used to connect two light-emitting units in series, so that the devices can achieve an effect of light-emitting superposition, which can successfully improve important photoelectric properties such as current efficiency, output brightness and operation life. Among them, CGL has a high carrier mobility and a high conductivity. When anode potentials of adjacent sub-pixels are different, certain transverse leakage will occur along the CGL, which will lead to crosstalk between adjacent sub-pixels and other problems.

SUMMARY

The following is a summary of subject matter described herein in detail. The summary is not intended to limit the protection scope of claims.

An embodiment of the present disclosure provides a display substrate, including a driving structure layer and a light emitting structure layer sequentially stacked on a base substrate; wherein, the light emitting structure layer includes a first electrode layer, a pixel definition layer, a light emitting functional layer, a second electrode layer, a third electrode layer and an electrode insulation layer;

the first electrode layer includes multiple first electrodes arranged on the driving structure layer, the pixel definition layer is arranged on a side of the multiple first electrodes away from the base substrate and is provided with multiple pixel openings, each of the pixel openings exposes a surface of one corresponding first electrode away from the base substrate; the pixel definition layer is further provided with a grid-shaped isolation groove structure, wherein the isolation groove structure includes multiple grid units, and each grid unit of the isolation groove structure surrounds one of the pixel openings;

the third electrode layer and the electrode insulation layer are sequentially stacked on a side of the pixel definition layer away from the base substrate and expose the pixel opening and the isolation groove structure, and the electrode insulation layer covers an edge portion of the third electrode layer close to a pixel opening;

the light emitting functional layer and the second electrode layer are sequentially stacked on a side of the multiple first electrodes and the electrode insulation layer away from the base substrate, and each first electrode, light emitting functional layer and second electrode layer form a light emitting device; the second electrode layer and the third electrode layer are configured to be equipotential;

the light emitting functional layer includes at least two stacked light emitting units, and a charge generation layer arranged between two adjacent light emitting units, wherein the charge generation layer is configured to generate holes and electrons under an action of a voltage of the first electrode and the second electrode layer, and the charge generation layer is isolated by the isolation groove structure.

An embodiment of the present disclosure further provides a display apparatus including the display substrate described above.

Other aspects may be understood upon reading and understanding the drawings and detailed description.

BRIEF DESCRIPTION OF DRAWINGS

Accompanying drawings are intended to provide a further understanding of technical solutions of the present disclosure and form a part of the specification, and are used to explain the technical solutions of the present disclosure together with embodiments of the present disclosure, and not intended to form limitations on the technical solutions of the present disclosure. Shapes and sizes of components in the drawings do not reflect actual scales, and are only intended to schematically illustrate contents of the present disclosure.

DETAILED DESCRIPTION

Those of ordinary skills in the art should understand that modifications or equivalent replacements may be made to the technical solutions of the embodiments of the present disclosure without departing from the spirit and scope of the technical solutions of the embodiments of the present disclosure, and should all fall within the scope of the claims of the present disclosure.

In some silicon-based OLED display panels, in order to solve the crosstalk problem of adjacent sub-pixels caused by transverse leakage of a CGL, the CGL is isolated by arranging a groove between adjacent sub-pixels. Although this method can mitigate the crosstalk problem between adjacent sub-pixels to a certain extent, but due to arrangement of the groove, the cathode layer will be recessed and form a sharp shape at a position corresponding to the groove (cathode puncture position). At the cathode puncture position, because of a tip effect of the electric field, the electric field intensity will rise sharply at this position, which will eventually lead to that an edge of a sub-pixel is light up ahead of time and affect the control and realization of low gray scale of sub-pixels.

Figure 1A:
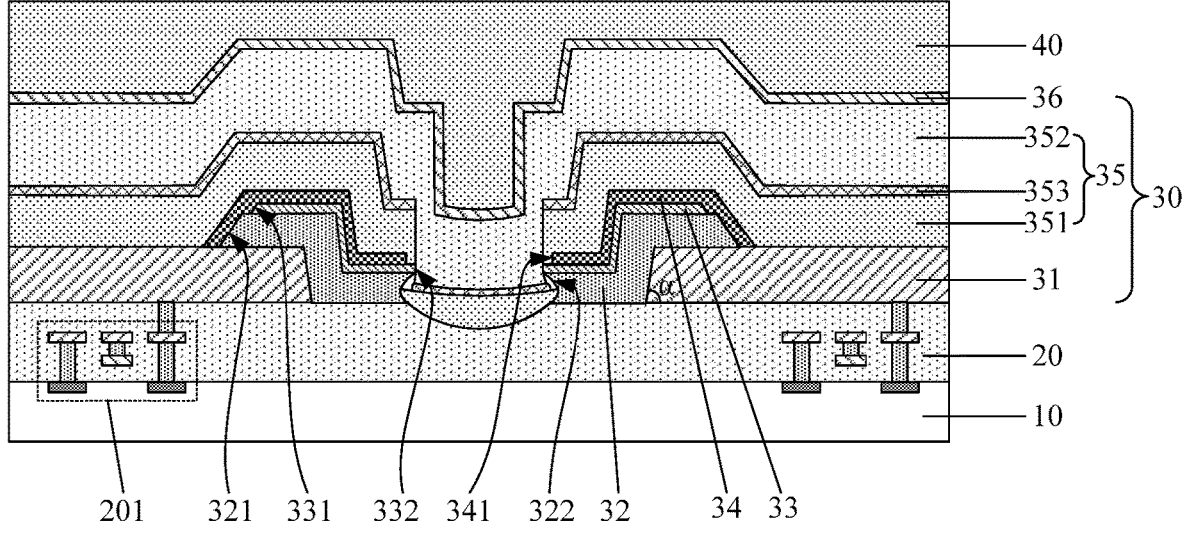
FIG. 1a is a schematic diagram of a partial structure of a display substrate according to some exemplary embodiments.
Figure 2:
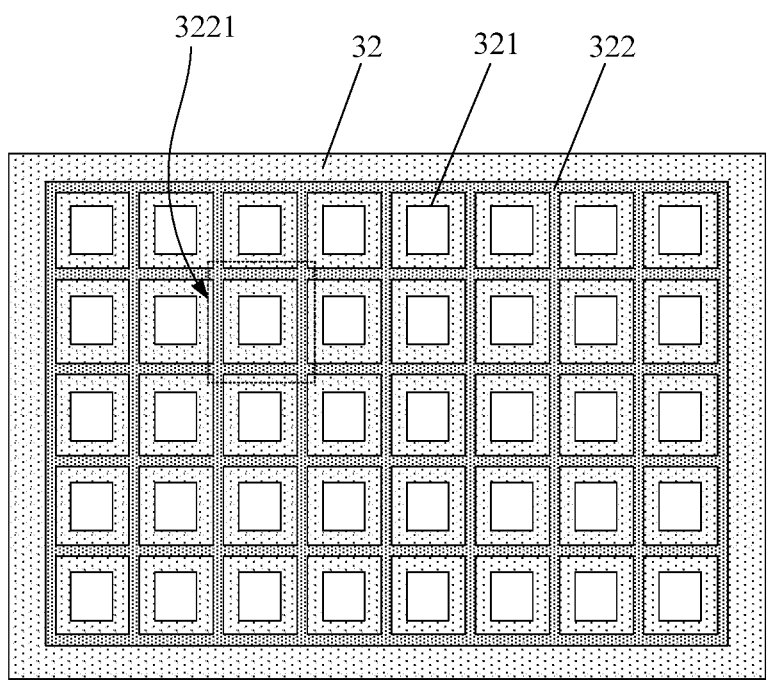
FIG. 2 is a schematic diagram of a planar structure of a pixel definition layer according to a display substrate of some exemplary embodiments.

An embodiment of the present disclosure provide a display substrate, in some exemplary embodiments, as shown in FIG. 1a and FIG. 2, FIG. 1a is a schematic diagram of a partial structure of a display substrate according to some exemplary embodiments, FIG. 2 is a schematic diagram of a planar structure of a pixel definition layer of a display substrate according to some exemplary embodiments. The display substrate includes a driving structure layer 20 and a light emitting structure layer 30 sequentially stacked on a base substrate 10. The light emitting structure layer 30 includes a first electrode layer, a pixel definition layer 32, a light emitting functional layer 35, a second electrode layer 36, a third electrode layer 33, and an electrode insulation layer 34.

The first electrode layer includes multiple first electrodes 31 arranged on the driving structure layer 20, the pixel definition layer 32 is arranged on a side of the multiple first electrodes 31 away from the base substrate 10 and is provided with multiple pixel openings 321. Each of the pixel openings 321 exposes a surface of one corresponding first electrode 31 away from the base substrate 10. The pixel definition layer 32 is further provided with a grid-like isolation groove structure 322, and the isolation groove structure 322 includes multiple grid units 3221 (shown in FIG. 2). Each grid unit 3221 of the isolation groove structure 322 surrounds one of the pixel openings 321.

The third electrode layer 33 and the electrode insulation layer 34 are sequentially stacked on a side of the pixel definition layer 32 away from the base substrate 10, and the pixel opening 321 and the isolation groove structure 322 are exposed, and the electrode insulation layer 34 covers an edge portion of the third electrode layer 33 close to the pixel opening 321.

The light emitting functional layer 35 and the second electrode layer 36 are sequentially stacked on a side of the multiple first electrodes 31 and the pixel definition layer 34 away from the base substrate 10. Each of the first electrodes 31, the light emitting functional layer 35 and the second electrode layer 36 form a light emitting device. The second electrode layer 36 and the third electrode layer 33 are configured to be equipotential.

The light emitting functional layer 35 includes at least two light emitting units stacked, and a charge generation layer 353 positioned between two adjacent light emitting units, the charge generation layer 353 is configured to generate holes and electrons under an action of the voltage of the first electrodes 31 and the second electrode layer 36, and the charge generation layer 353 is isolated by the isolation groove structure 322.

In the display substrate of the embodiment of the present disclosure, the pixel definition layer 32 is provided with an isolation groove structure 322 between adjacent sub-pixel regions (i.e., pixel opening 321 regions) to isolate the charge generation layer 353, thereby mitigating problems such as crosstalk of adjacent sub-pixels due to lateral leakage generated by the charge generation layer 353. Further, the third electrode layer 33 and the electrode insulation layer 34 are sequentially stacked on the side of the pixel definition layer 32 away from the base substrate 10, and the third electrode layer 33 and the second electrode layer 36 are configured to be equipotential, whereby an electric field strength at the puncture position of the second electrode layer 36 can be weakened by the third electrode layer 33 arranged, thereby improving a puncture phenomenon of the second electrode layer 36 at a position corresponding to the isolation groove structure 322. The potential of the third electrode layer 33 is the same as that of the second electrode layer 36, so that the problem of light emission of a light emitting material between adjacent sub-pixels due to the presence of voltage between the third electrode layer 33 and the second electrode layer 36 can be avoided. In addition, the electrode insulation layer 34 is configured to cover an edge portion of the third electrode layer 33 close to the pixel opening 321, thus, the first electrodes 31 and the third electrode layer 33 may be separated by the electrode insulation layer 34, thereby avoiding a leakage problem caused by lapping between the first electrodes 31 and the third electrode layer 33 by the light emitting functional layer 35, so as to avoid an increase in power consumption of a light emitting device.

In some exemplary embodiments, as shown in FIG. 1a, the third electrode layer 33 is provided with a first opening 331 exposing the pixel opening 321, and an orthographic projection of the first opening 331 on the base substrate 10 contains an orthographic projection of the pixel opening 321 on the base substrate 10. In this way, a circumferential sidewall of the first opening 331 of the third electrode layer 33 is positioned on a surface of the pixel definition layer 32 away from the base substrate 10, thereby avoiding electric leakage caused by contact with the first electrode 31, and facilitating the electrode insulation layer 34 to completely cover the circumferential sidewall of the first opening 331 of the third electrode layer 33.

Herein, "an orthographic projection of A contains an orthographic projection of B" means that the orthographic projection of B falls within a range of the orthographic projection of A, or the orthographic projection of A covers the orthographic projection of B.

Herein, a circumferential sidewall of the pixel opening 321 may be a inclined plane, an end of the pixel opening 321 away from the base substrate 10 is larger than an end of the pixel opening close to the base substrate 10, and the orthographic projection of the pixel opening 321 on the base substrate 10 may refer to an orthographic projection of an end of the pixel opening 321 away from the base substrate 10 on the base substrate 10.

Exemplarily, a shape of the pixel opening 321 may be rectangular, hexagonal, pentagonal, rhombic or the like, and the shape of the pixel opening 321 may be adapted to the shape of a first electrode 31. Shapes of the multiple pixel openings 321 may be the same or different. In the embodiments of the present disclosure, the shapes and arrangement of the pixel openings 321 are not limited. Each grid unit 3221 of the isolation groove structure 322 is a closed annular structure, and a shape of the grid unit 3221 may be adapted to the shape of the pixel opening 321 which is surrounded by the grid unit 3221. In an example of FIG. 2, the pixel openings 321 are rectangular and each grid unit 3221 of the isolation groove structure 322 is rectangular.

In some exemplary embodiments, as shown in FIG. 1a, the electrode insulation layer 34 covers the circumferential sidewall of the pixel opening 321. In this way, it is advantageous to ensure that the electrode insulation layer 34 completely covers the circumferential sidewall of the first opening 331 of the third electrode layer 33 to isolate the first electrode 31 from the third electrode layer 33.

In some exemplary embodiments, a material of the electrode insulation layer 34 may be made of an inorganic insulation material, and for example may include any one or more of silicon nitride ($SiN_x$), silicon oxide ($SiO_x$), and silicon oxynitride ($SiO_xN_y$). The material of the third electrode layer 33 may be a metal material or an alloy material, and for example may include any one or more of titanium, aluminum, silver, and copper.

In some exemplary embodiments, as shown in FIG. 1a, the third electrode layer 33 is provided with a second opening 332 exposing the isolation groove structure 322, and an orthographic projection of the isolation groove structure 322 on the base substrate 10 may contain an orthographic projection of the second opening 332 on the base substrate 10. In this way, a circumferential sidewall of the second opening 332 of the third electrode layer 33 may protrude from or be flush with the opening of the isolation groove structure 322, which is beneficial for the isolation groove structure 322 to effectively isolate the charge generation layer 353.

In an example of this embodiment, as shown in FIG. 1a, the electrode insulation layer 34 is provided with a third opening 341 exposing the isolation groove structure 322, and an orthographic projection of the third opening 341 on the base substrate 10 may contain an orthographic projection of the second opening 332 on the base substrate 10. An orthographic projection of the electrode insulation layer 34 on the base substrate 10 may be overlapped with the orthographic projection of the isolation groove structure 322 on the base substrate 10. In this example, a circumferential sidewall of the third opening 341 may have a small amount of inward shrinkage, with respect to the circumferential sidewall of the second opening 332, to avoid a risk of breakage due to protrusion of the electrode insulation layer 34.

Figure 1B:
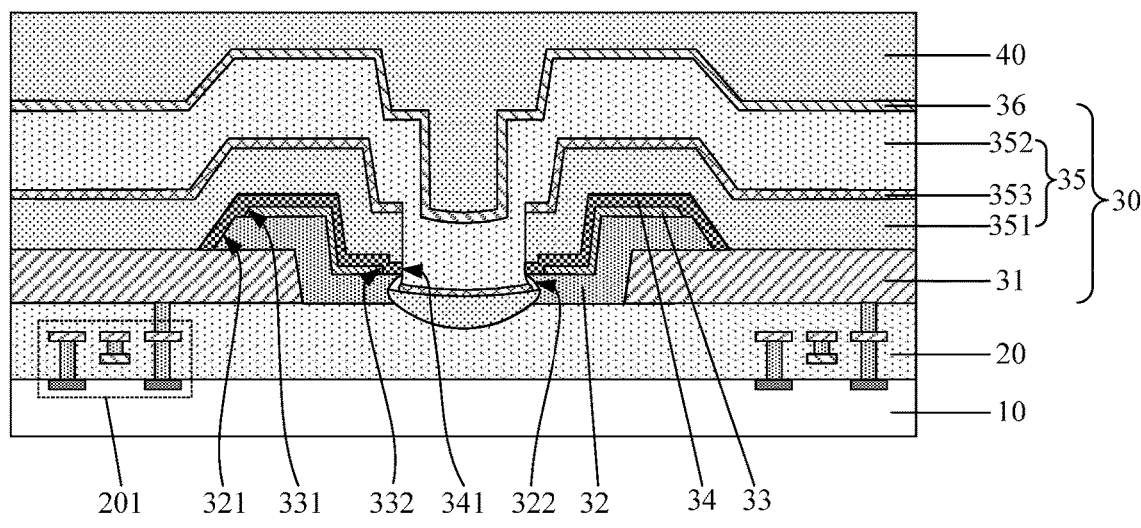
FIG. 1b is a schematic diagram of a partial structure of a display substrate according to some other exemplary embodiments.

In some other exemplary embodiments, as shown in FIG. 1b, FIG. 1b is a schematic diagram of a partial structure of a display substrate according to some other exemplary embodiments, an orthographic projection of the electrode insulation layer 34 on the base substrate 10 may contain an orthographic projection of the third electrode layer 33 on the base substrate 10.

In an example of this embodiment, as shown in FIG. 1b, the third electrode layer 33 is provided with a second opening 332 exposing the isolation groove structure 322, and the electrode insulation layer 34 is provided with a third opening 341 exposing the isolation groove structure 322, and the orthographic projection of the second opening 332 on the base substrate 10 may contain the orthographic projection of the third opening 341 on the base substrate 10. In this example, the electrode insulation layer 34 may completely cover the circumferential sidewall of the second opening 332 of the third electrode layer 33.

In an example of this embodiment, as shown in FIG. 1b, the orthographic projection of the isolation groove structure 322 on the base substrate may contain the orthographic projection of the third opening 341 on the base substrate. In this example, the circumferential sidewall of the third opening 341 may protrude from or be flush with the opening of the isolation groove structure 322.

In some exemplary embodiments, as shown in FIG. 1a, a sidewall of the first electrode 31 in a thickness direction is slope-shaped, and an included angle α between the sidewall of the first electrode 31 in the thickness direction and a surface of the first electrode 31 facing the base substrate 10 may be 60 degrees to 80 degrees. In this way, a slope value of the sidewall of the first electrode 31 in the thickness direction is relatively gentle, which may mitigate a sharp shape of the second electrode layer 36 at a position corresponding to the edge of the first electrode 31, and the puncture phenomenon of the second electrode layer 36 at this position may be mitigated.

In some exemplary embodiments, as shown in FIG. 1a, an inner side surface of the isolation groove structure 322 may be an arc-shaped concave surface. Thus, when the charge generation layer 353 is formed by evaporation, it is more advantageous for the isolation groove structure 322 to isolate the charge generation layer 353.

In an example of this embodiment, as shown in FIG. 1a, a bottom surface of the isolation groove structure 322 may be an arc-shaped concave surface that is recessed towards the base substrate 10. The inner side surface of the isolation groove structure 322 may be an arc-shaped surface that is smoothly connected with the bottom surface. Thus, the shape of the second electrode layer 36 formed subsequently at a position corresponding to the isolation groove structure 322 is relatively flat, and the sharp shape is not easily formed, thereby mitigating the puncture phenomenon of the second electrode layer 36 at this position.

In some exemplary embodiments, as shown in FIG. 1a, the isolation groove structure 322 may penetrate through the pixel definition layer 32 and be partially located in the driving structure layer 20. Exemplarily, the driving structure layer 20 may include a pixel driving circuit arranged on the base substrate 10 and a planarization layer away from the base substrate 10, and the first electrode 31 is arranged on the planarization layer and connected with the pixel driving circuit through a via arranged in the planarization layer. The isolation groove structure 322 may penetrate through the pixel definition layer 32 and be partially located in the planarization layer. In some other embodiments, when a thickness of the pixel definition layer 32 is relatively large, the isolation groove structure 322 may not penetrate through the pixel definition layer 32.

In some exemplary embodiments, the display substrate includes a display area and a non-display area positioned on a periphery of the display area, the third electrode layer is positioned in the display area and may extend to the non-display area, and the third electrode layer may be connected with traces in the driving structure layer of the non-display area through a via provided in the driving structure layer of the non-display area, so that a potential of the third electrode layer is the same as that of the second electrode layer.

In some exemplary embodiments, as shown in FIG. 1a, the display substrate may be a silicon-based OLED display substrate, and the driving structure layer 20 includes multiple pixel driving circuits arranged on the silicon-based substrate 10, the pixel driving circuit may be manufactured using a CMOS (complementary metal oxide semiconductor) integrated circuit process. A pixel driving circuit may include multiple transistors (T) 201 and a storage capacitor (C), and the pixel driving circuit may have a circuit structure such as 3T1C, 5T1C or 7T1C, which is not limited in the present disclosure.

In some exemplary embodiments, as shown in FIG. 1a, the display substrate may be a silicon-based OLED display substrate. The light emitting functional layer 35 may include a first light emitting unit 351, the charge generation layer 353, and a second light emitting unit 352 that are sequentially stacked in a direction away from the base substrate 10. The first light emitting unit 351 includes stacked a first light emitting layer capable of emitting red light and a second light emitting layer capable of emitting green light, and the second light emitting unit 352 includes a third light emitting layer capable of emitting blue light. Thus, under an action of voltages of the first electrode 31 and the second electrode layer 36, the light emitting device can emit white light through superposition of the light emitted by the first light emitting layer, the light emitted by the second light emitting layer and the light emitted by the third light emitting layer.

Exemplarily, the light emitting device may include a first electrode (anode), a first hole injection layer, a first hole transport layer, a first light emitting layer, a second light emitting layer, a first electron transport layer, a charge generation layer, a second hole injection layer, a second hole transport layer, a third hole transport layer, a third light emitting layer, a hole block layer, a second electron transport layer, an electron injection layer and a second electrode (cathode) layer sequentially stacked in a direction away from the base substrate.

In some exemplary embodiments, as shown in FIG. 1a, the display substrate may further include an encapsulation structure layer 40 arranged on a side of the second electrode layer 36 away from the base substrate 10, and the encapsulation structure layer 40 may include multiple stacked layers of inorganic materials (such as silicon oxide, silicon nitride, silicon oxynitride, etc.) to protect the light emitting device by blocking external moisture and oxygen. The display substrate may further include a color filter layer arranged on a side of the encapsulation structure layer away from the base substrate. The color filter layer may include multiple light filter units that allows light of a set color to transmit, for example, a red light filter unit allowing red light to transmit, a green light filter unit allowing green light to transmit, and a blue light filter unit allowing blue light to transmit. The white light emitted by each light emitting device may irradiate on a light filter unit and then emit light of a corresponding color.

Exemplary description is made below for a preparation process of a display substrate of an embodiment of the present disclosure. A "patterning process" mentioned in the present disclosure includes processes such as photoresist coating, mask exposure, development, etching, and photoresist stripping. Deposition may be any one or more of sputtering, evaporation, and chemical vapor deposition. Coating may be any one or more of spray coating and spin coating. Etching may be any one or more of dry etching and wet etching. A "thin film" refers to a layer of a thin film prepared from a material on a base substrate using a process of deposition or coating. If no patterning process is needed for the "thin film" in the whole preparation process, the "thin film" may also be called a "layer". If the patterning process is needed for the "thin film" in the whole preparation process, the thin film is called a "thin film" before the patterning process and called a "layer" after the patterning process. The "layer" after the patterning process includes at least one "pattern". "A and B are arranged in a same layer" in the present disclosure refers to that A and B are simultaneously formed by a same patterning process. In the present disclosure, "an orthographic projection of A contains an orthographic projection of B" means that the orthographic projection of B falls within a range of the orthographic projection of A, or the orthographic projection of A covers the orthographic projection of B.

Taking the structure of the display substrate illustrated in FIG. 1a as an example, the preparation process of the display substrate of the embodiment of the present disclosure is described, and the display substrate illustrated in FIG. 1a is a silicon-based OLED display substrate and taken as an example, and the preparation process may include the following steps:

(1) A driving structure layer 20 is formed on a base substrate 10. Exemplarily, the base substrate 10 may be a silicon-based base substrate 10, such as a monocrystalline silicon base substrate 10, on which a pixel driving circuit and some signal lines (including data signal lines, scan signal lines, power supply lines, etc.) are prepared using a CMOS integrated circuit process. The pixel driving circuit may include multiple transistors (T) 201 and a storage capacitor (C), and the pixel driving circuit may have a circuit structure such as 3T1C, 5T1C or 7T1C, which is not limited in the present disclosure.

Figure 3:
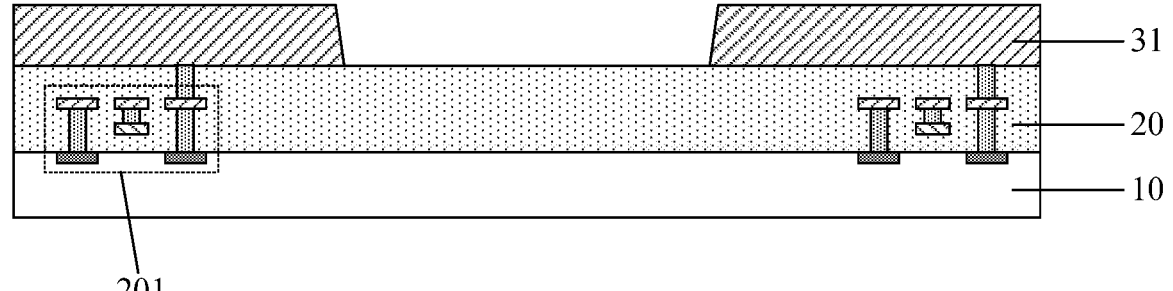
FIG. 3 is a schematic diagram of a structure after a driving structure layer and multiple first electrodes are formed on a base substrate in some exemplary embodiments.

(2) Multiple first electrodes 31 are formed on the driving structure layer 20. Exemplarily, forming the multiple first electrodes 31 may include: a first electrode thin film is deposited on the driving structure layer 20, the first electrode thin film is patterned by a patterning process to form a first electrode layer, and the first electrode layer includes multiple first electrodes 31. The first electrodes 31 are connected with pixel driving circuits in the driving structure layer 20 through vias arranged in the driving structure layer 20, as shown in FIG. 3.

Figure 4:
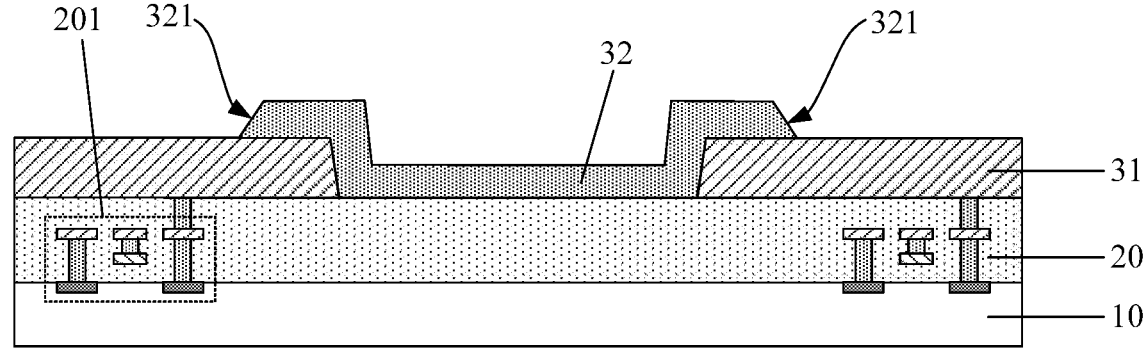
FIG. 4 is a schematic diagram of a structure after a pixel definition layer is formed in some exemplary embodiments.

(3) A pixel definition layer 32 is formed. Exemplarily, forming the pixel definition layer 32 may include: a pixel definition thin film is formed on the base substrate 10 on which the aforementioned patterns are formed, and the pixel definition thin film is patterned by a patterning process to form the pixel definition layer 32. The pixel definition layer 32 is provided with multiple pixel openings 321, and each pixel opening 321 exposes a surface of a corresponding first electrode 31 away from the base substrate 10, as shown in FIG. 4.

Figure 5:
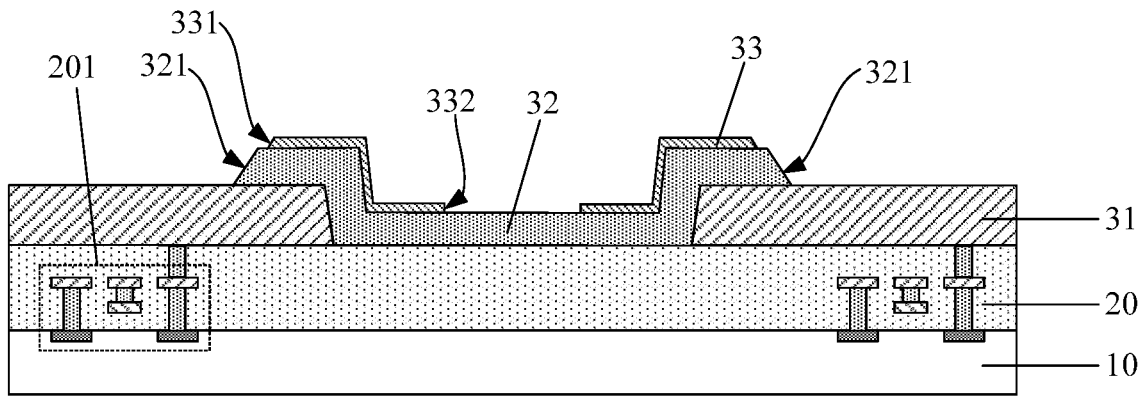
FIG. 5 is a schematic diagram of a structure after a third electrode layer is formed in some exemplary embodiments.

(4) A third electrode layer 33 is formed. Exemplarily, forming the third electrode layer 33 may include: a third electrode thin film is deposited on the base substrate on which the aforementioned patterns are formed, and the third electrode thin film is patterned by a patterning process to form the third electrode layer 33. The third electrode layer 33 is provided with first openings 331 exposing the pixel openings 321 and second openings 332, wherein an orthographic projection of the first openings 331 on the base substrate 10 contains an orthographic projection of the pixel openings 321 on the base substrate 10, as shown in FIG. 5.

Figure 6:
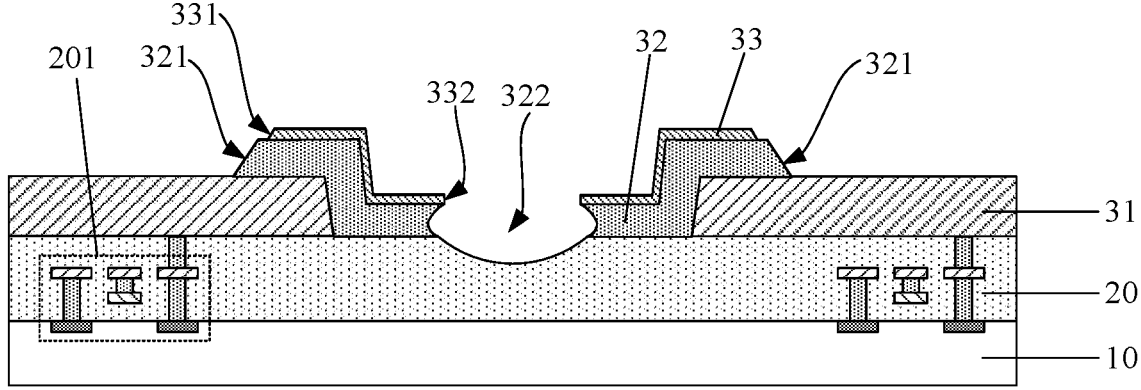
FIG. 6 is a schematic diagram of a structure after an isolation groove structure is formed in some exemplary embodiments.

(5) An isolation groove structure 322 is formed. Exemplarily, forming the isolation groove structure 322 may include: a photoresist is coated on the base substrate 10 on which the aforementioned patterns are formed, then the photoresist at positions of the second opening 332 is removed by exposure and development, a portion of the pixel definition layer 32 exposed by the second openings 332 is etched, thereby forming an isolation groove structure 322 on the pixel definition layer 32, and then the photoresist is removed. Exemplarily, the isolation groove structure 322 may penetrate through the pixel definition layer 32 and be partially positioned in the driving structure layer 20, as shown in FIG. 6.

Figure 7:
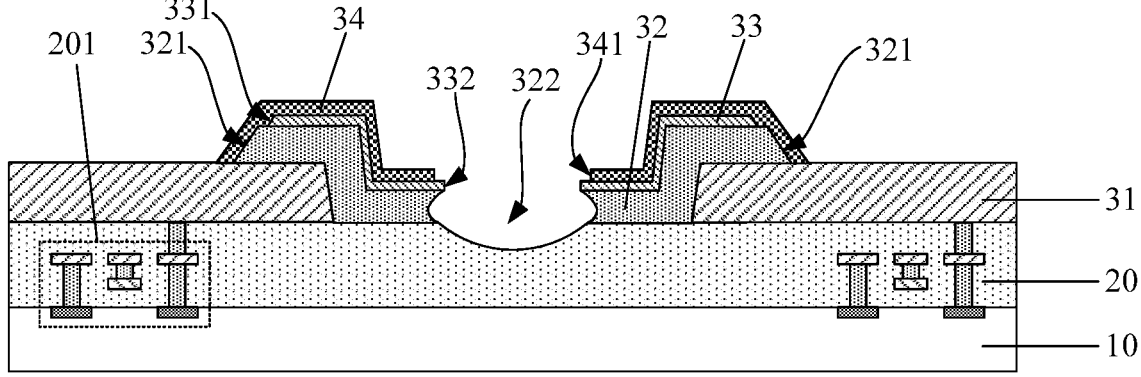
FIG. 7 is a schematic diagram of a structure after an electrode insulation layer is formed in some exemplary embodiments.

(6) An electrode insulation layer 34 is formed. Exemplarily, forming the electrode insulation layer 34 may include: an electrode insulation thin film is formed on the base substrate 10 on which the aforementioned patterns are formed, and the electrode insulation thin film is patterned by a patterning process to form the electrode insulation layer 34. The electrode insulation layer 34 completely covers the third electrode layer 33, and the pixel openings 321 and the isolation groove structure 322 (the third openings 341 provided with the electrode insulation layer 34 exposes the isolation groove structure 322) are exposed, as shown in FIG. 7.

Figure 8:
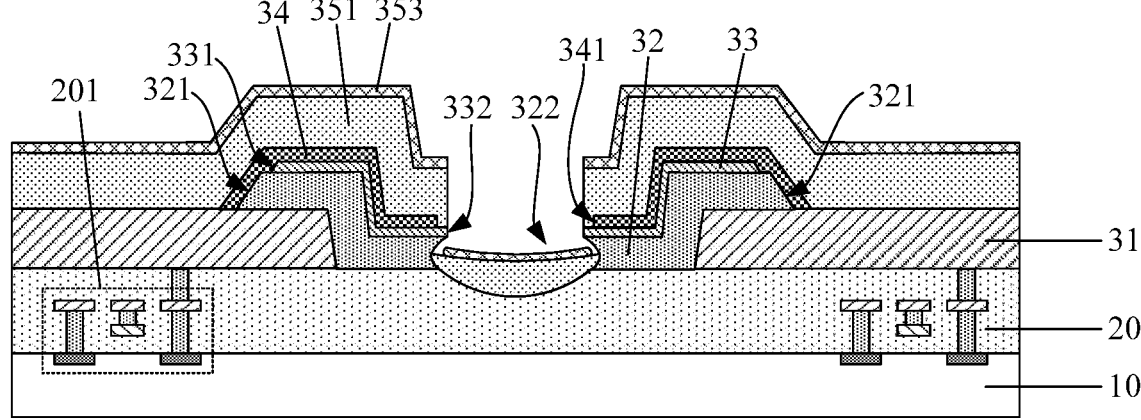
FIG. 8 is a schematic diagram of a structure after a charge generation layer is formed in some exemplary embodiments.

(7) A light emitting functional layer 35 is formed. Exemplarily, forming the light emitting functional layer 35 may include: each film layer of the light emitting functional layer 35 is sequentially evaporated on the base substrate 10 on which the aforementioned patterns are formed, wherein the light emitting functional layer 35 may include a first light emitting unit 351, the charge generation layer 353, and a second light emitting unit 352 that are sequentially stacked in a direction away from the base substrate 10; the first light emitting unit 351 includes a first light emitting layer capable of emitting red light and a second light emitting layer capable of emitting green light that are stacked, and the second light emitting unit 352 includes a third light emitting layer capable of emitting blue light. During evaporation, the charge generation layer 353 is naturally disconnected at the isolation groove structure 322, as shown in FIG. 8.

(8) A second electrode layer 36 is formed. Exemplarily, the second electrode layer 36 may be formed on the base substrate 10 on which the aforementioned patterns are formed using an evaporation process, as shown in FIG. 1a.

Thereafter, film layers, such as an encapsulation structure layer 40 and a color filter layer, are sequentially formed on a side of the second electrode layer 36 away from the base substrate 10.

In some other exemplary embodiments, during the preparation process of the display substrate illustrated in FIG. 1b, the pattern of the electrode insulation layer 34 may be formed after the pattern of the third electrode layer 33 is formed, and then the isolation groove structure 322 may be formed on the pixel definition layer 32. The specific process may refer to the preparation process of the display substrate illustrated in FIG. 1a.

An embodiment of the present disclosure further provides a display apparatus, which includes the display substrate according to any one of the previous embodiments. The display apparatus may be a near-eye display apparatus, such as AR/VR glasses, a helmet display, a virtual reality all-in-one device and the like.

In the accompanying drawings, a size of a constituent element, and a thickness of a layer or a region are sometimes exaggerated for clarity. Therefore, an implementation of the present disclosure is not necessarily limited to the size, and the shape and size of each component in the drawings do not reflect an actual scale. In addition, the drawings schematically illustrate some examples, and an implementation of the present disclosure is not limited to the shapes or numerical values shown in the drawings.

In the specification, a transistor refers to an element which includes at least three terminals, i.e., a gate electrode, a drain electrode and a source electrode. The transistor has a channel region between the drain electrode (drain electrode terminal, drain region, or drain) and the source electrode (source electrode terminal, source region, or source), and a current may flow through the drain electrode, the channel region, and the source electrode. In the specification, the channel region refers to a region through which a current mainly flows.

In the specification, in order to distinguish two electrodes of a transistor other than a control electrode, one of the two electrodes is directly described as a first electrode, while the other is described as a second electrode. The first electrode may be a drain electrode, and a second electrode may be a source electrode. Or, the first electrode may be a source electrode, and the second electrode may be a drain electrode. In cases that transistors with opposite polarities are used, a current direction changes during operation of a circuit, or the like, functions of the "source electrode" and the "drain electrode" are sometimes interchangeable. Therefore, the "source electrode" and the "drain electrode" are interchangeable in the specification.

In the description herein, "parallel" refers to a state in which an angle formed by two straight lines is above −10° and below 10°, and thus also includes a state in which the angle is above −5° and below 5°. In addition, "vertical" refers to a state in which an angle formed by two straight lines is above 800 and below 100°, and thus also includes a state in which the angle is above 850 and below 95°.

In the specification, for convenience, wordings indicating orientation or positional relationships, such as "middle", "upper", "lower", "front", "back", "vertical", "horizontal", "top", "bottom", "inside", and "outside", are used for illustrating positional relationships between constituent elements with reference to the drawings, and are merely for facilitating the description of the specification and simplifying the description, rather than indicating or implying that a referred apparatus or element must have a particular orientation and be constructed and operated in the particular orientation. Therefore, they cannot be understood as limitations on the present disclosure. The positional relationships between the constituent elements may be changed as appropriate according to directions for describing the various constituent elements. Therefore, appropriate replacements may be made according to situations without being limited to the wordings described in the specification.

In the description herein, unless otherwise specified and defined explicitly, the terms "connection", "fixed connection", "installation" and "assembly" should be understood in a broad sense, and, for example, a connection may be a fixed connection, a detachable connection or an integrated connection; the terms "installation", "connection" and "fixed connection" may be a direct connection, an indirect connection through intermediate components, or an internal communication between two components. For those ordinarily skilled in the art, meanings of the above terms in the embodiments of the present disclosure may be understood according to situations.

The invention claimed is:

1. A display substrate, comprising: a driving structure layer and a light emitting structure layer sequentially stacked on a base substrate; wherein the light emitting structure layer comprises a first electrode layer, a pixel definition layer, a light emitting functional layer, a second electrode layer, a third electrode layer and an electrode insulation layer;

the first electrode layer comprises a plurality of first electrodes arranged on the driving structure layer, the pixel definition layer is arranged on a side of the plurality of first electrodes away from the base substrate and is provided with a plurality of pixel openings, each of the pixel openings exposes a surface of one corresponding first electrode away from the base substrate; the pixel definition layer is further provided with a grid-shaped isolation groove structure, wherein the isolation groove structure comprises a plurality of grid units, and each grid unit of the isolation groove structure surrounds one of the pixel openings;

the third electrode layer and the electrode insulation layer are sequentially stacked on a side of the pixel definition layer away from the base substrate and expose the pixel openings and the isolation groove structure, and the electrode insulation layer covers an edge portion of the third electrode layer close to a pixel opening;

the light emitting functional layer and the second electrode layer are sequentially stacked on a side of the plurality of first electrodes and the electrode insulation layer away from the base substrate, and each first electrode, the light emitting functional layer and the second electrode layer form a light emitting device; the second electrode layer and the third electrode layer are configured to be equipotential;

the light emitting functional layer comprises at least two stacked light emitting units, and a charge generation layer arranged between two adjacent light emitting units, wherein the charge generation layer is configured to generate holes and electrons under an action of a voltage of the first electrode and the second electrode layer, and the charge generation layer is isolated by the isolation groove structure.

2. The display substrate according to of claim 1, wherein, the third electrode layer is provided with a first opening exposing the pixel opening, and an orthographic projection of the first opening on the base substrate contains an orthographic projection of the pixel opening on the base substrate.

3. The display substrate according to claim 2, wherein the electrode insulation layer covers circumferential sidewalls of the pixel openings.

4. The display substrate according to claim 1, wherein the third electrode layer is provided with a second opening exposing the isolation groove structure, and an orthographic projection of the second opening on the base substrate contains an orthographic projection of the second opening on the base substrate.

5. The display substrate according to claim 4, wherein the electrode insulation layer is provided with a third opening exposing the isolation groove structure, and an orthographic projection of the third opening on the base substrate contains the orthographic projection of the second opening on the base substrate; an orthographic projection of the electrode insulation layer on the base substrate is overlapped with an orthographic projection of the isolation groove structure on the base substrate.

6. The display substrate according to claim 1, wherein an orthographic projection of the electrode insulation layer on the base substrate contains an orthographic projection of the third electrode layer on the base substrate.

7. The display substrate according to claim 6, wherein the third electrode layer is provided with a second opening exposing the isolation groove structure, the electrode insulation layer is provided with a third opening exposing the isolation groove structure, and an orthographic projection of the second opening on the base substrate contains an orthographic projection of the third opening on the base substrate.

8. The display substrate according to claim 7, wherein an orthographic projection of the isolation groove structure on the base substrate contains the orthographic projection of the third opening on the base substrate.

9. The display substrate according to claim 1, wherein a sidewall of a first electrode in a thickness direction is slope-shaped and an included angle between the sidewall of the first electrode in the thickness direction and a surface of the first electrode facing the base substrate is 60 degrees to 80 degrees.

10. The display substrate according to claim 1, wherein an inner side surface of the isolation groove structure is an arc-shaped concave surface.

11. The display substrate according to claim 10, wherein a bottom surface of the isolation groove structure is an arc-shaped concave surface that is recessed towards the base substrate.

12. The display substrate according to claim 11, wherein the inner side surface of the isolation groove structure is smoothly connected with the bottom surface.

13. The display substrate according to claim 1, wherein the isolation groove structure penetrates through the pixel definition layer and is partially located in the driving structure layer.

14. The display substrate according to claim 1, wherein a material of the electrode insulation layer comprises any one or more of silicon nitride, silicon oxide and silicon oxynitride.

15. The display substrate according to claim 1, wherein the light emitting functional layer comprises a first light emitting unit, the charge generation layer, and a second light emitting unit that are sequentially stacked in a direction away from the base substrate; the first light emitting unit comprises a first light emitting layer capable of emitting red light and a second light emitting layer capable of emitting green light that are stacked, and the second light emitting unit comprises a third light emitting layer capable of emitting blue light.

16. A display apparatus, comprising the display substrate according to claim 1.

* * * * *